(12) United States Patent
Matsunaga

(10) Patent No.: US 8,508,295 B2
(45) Date of Patent: Aug. 13, 2013

(54) AMPLIFIER

(75) Inventor: Koji Matsunaga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/922,781

(22) PCT Filed: Apr. 22, 2009

(86) PCT No.: PCT/JP2009/057966
§ 371 (c)(1),
(2), (4) Date: Sep. 15, 2010

(87) PCT Pub. No.: WO2009/131138
PCT Pub. Date: Oct. 29, 2009

(65) Prior Publication Data
US 2011/0025412 A1 Feb. 3, 2011

(30) Foreign Application Priority Data
Apr. 24, 2008 (JP) ................................. 2008-113433

(51) Int. Cl.
*H03F 3/68* (2006.01)

(52) U.S. Cl.
USPC ..................................... 330/124 R; 330/295

(58) Field of Classification Search
USPC ................. 330/124 R, 295, 84, 126
See application file for complete search history.

(56) References Cited

U.S. PATENT DOCUMENTS

| | | | |
|---|---|---|---|
| 6,262,629 B1 * | 7/2001 | Stengel et al. ............. | 330/124 R |
| 6,617,929 B2 * | 9/2003 | Yi et al. ......................... | 330/295 |
| 7,262,656 B2 * | 8/2007 | Shiikuma .................. | 330/124 R |
| 7,427,895 B1 * | 9/2008 | Okubo et al. ............. | 330/124 R |
| 7,663,435 B2 * | 2/2010 | Kim et al. .................. | 330/124 R |
| 2002/0135425 A1 * | 9/2002 | Kim et al. ..................... | 330/295 |
| 2004/0189381 A1 * | 9/2004 | Louis ......................... | 330/124 R |
| 2006/0044060 A1 * | 3/2006 | Shiikuma .................. | 330/124 R |
| 2008/0191801 A1 * | 8/2008 | Kim et al. .................. | 330/124 R |
| 2009/0102553 A1 * | 4/2009 | Yang et al. ................ | 330/124 R |
| 2009/0167434 A1 * | 7/2009 | Elmala ....................... | 330/124 R |

FOREIGN PATENT DOCUMENTS

| | | |
|---|---|---|
| JP | 63-153904 A | 6/1988 |
| JP | 2003209447 A | 7/2003 |
| JP | 2004120086 A | 4/2004 |
| JP | 2005175819 A | 6/2005 |
| JP | 2006197556 A | 7/2006 |
| JP | 2006332829 A | 12/2006 |
| JP | 2006345341 A | 12/2006 |

OTHER PUBLICATIONS

International Search Report for PCT/JP2009/057966 mailed Jul. 7, 2009.

\* cited by examiner

*Primary Examiner* — Henry Choe

(57) ABSTRACT

A amplifier that obtains an output by power combining, comprising; a distribution circuit that distributes an input signal into two signals; a first amplifier circuit that amplifies one of the two signals distributed by the distribution circuit and operates in class AB mode; a second amplifier circuit that amplifies the other of the two signals distributed by the distribution circuit and operates in class B or C mode; a lumped constant circuit that connects outputs of the first and second amplifier circuits; a first impedance transformation circuit connected to an output of the first amplifier circuit; a second impedance transformation circuit connected to an output of the second amplifier circuit, and a quarter wavelength impedance transformation circuit with one end thereof connected to a combining point of output sides of the first and second impedance transformation circuits and with the other end thereof connected to a load (FIG. 1).

4 Claims, 4 Drawing Sheets

AMPLIFIER

REFERENCE TO RELATED APPLICATION

The present invention is the National Phase of PCT/JP2009/057966, filed Apr. 22, 2009, which is based upon and claims the benefit of the priority of Japanese patent application No. 2008-113433, filed on Apr. 24, 2008, the disclosure of which is incorporated herein in its entirety by reference thereto.

TECHNICAL FIELD

The present invention relates to an amplifier. More specifically, the invention relates to a Doherty-type amplifier.

BACKGROUND

Due to higher functionality of wireless systems, a method of improving a transmission capacity by using a CDMA signal or orthogonal multiplexing time division such as OFDM has become the mainstream. It is known that, when such a multiplexed signal is amplified, an output signal having power of four or more times average power arises in a time component of the output signal. At this time of amplification, an output characteristic of a non-linear amplifier may be distorted, and sufficient signal amplification and demodulation may not therefore be achieved. Then, an amplifier traditionally referred to as a Doherty-type amplifier based on a Doherty operation, which efficiently operates, has been proposed and put to practical use.

A configuration of the traditional Doherty-type amplifier is shown in FIG. 4. The traditional Doherty-type amplifier is formed of a carrier amplifier 102 that operates in class AB mode in which linear amplification is performed, and a peak amplifier 103 that operates in B or C mode in which power equal to or more than a certain input level is amplified. An input signal is divided by power distribution, and a divided signal is usually shifted with a phase difference (normally 90 degrees) by a phase shifter 101. The signal with the phase difference is supplied to the peak amplifier 103. To an output side of the carrier amplifier 102, a quarter wavelength impedance transformation circuit 104 is connected. After being combined with the signal from the peak amplifier 103, the resulting signal is connected to a load 110 through the quarter wavelength impedance transformation circuit 109.

In such a Doherty amplifier, when the peak amplifier 103 is turned off, the impedance on the side of the peak amplifier 103 seen from a power combining point is substantially infinite. In this case, by setting a characteristic impedance of the quarter wavelength impedance transformation circuit 104 on the output side of the carrier amplifier 102 to double that of the load 110 and setting a characteristic impedance Zc of the quarter wavelength impedance transformation circuit 109 after power combining to $Z_c = RL/\sqrt{2}$, the impedance on the output side of the carrier amplifier 102 is increased to 2RL.

At this time, only the carrier amplifier 102 operates in a high-impedance state, and power consumption of the peak amplifier 103 is substantially zero. Accordingly, an operation with an efficiency higher than that of a B-class amplifier becomes possible particularly at an output level with a large back-off amount.

Next, when the peak amplifier 103 is turned on by a certain input signal, the impedance at the power combining point assumes RL/2. Accordingly, the load impedance of each of the carrier amplifier 102 and the peak amplifier 103 is transformed to RL by the quarter wavelength impedance transformation circuit (having a characteristic impedance of $RL/2^{0.5}$). It means that an impedance $Z_2$ for the output side of the carrier amplifier 102 varies as follows:

$Z_2 = 2RL$: when the peak amplifier is turned off
$Z_2 = RL$: when the peak amplifier is turned on When the peak amplifier is turned on, a high output characteristic is obtained by a power combining operation by the two power amplifiers. When the peak amplifier operates, due to addition of a high efficiency characteristic of the peak amplifier, deterioration of an efficiency characteristic as an entirety of the Doherty amplifier is small.

Examples of an amplifier in which a quarter wavelength line is not used for an impedance transformation circuit are disclosed in Patent Documents 1, 2, and 3.

Patent Document 1:
JP Patent Kokai Publication No. JP-P2006-197556A
Patent Document 2:
JP Patent Kokai Publication No. JP-P2006-332829A
Patent Document 3:
JP Patent Kokai Publication No. JP-P2006-345341A

SUMMARY

The entire disclosures of the above Patent Documents 1 to 3 are incorporated herein by reference thereto. The following analysis has been given by the present invention.

In the traditional Doherty amplifier, impedance transformation is performed by the quarter wavelength impedance transformation circuits. Thus, the size of an entire power combining circuit on an output side may increase. When a use frequency is 1 GHz, for example, the line length of the quarter wavelength impedance transformation circuit becomes as long as 7.5 cm. Accordingly, application of the quarter wavelength impedance transformation circuit to a terminal device is difficult. Further, when the quarter wavelength impedance transformation circuit connected to the output side of the carrier amplifier is actually implemented on a substrate, a problem of a transmission loss or a power combining loss due to the long line length may arise. When the Doherty amplifier is implemented for a UHF band or an L band used for a broadcasting base station, a mobile base station, or the like, it is not easy to reduce the size of the entire of the base stations. Thus it is difficult to reduce the cost.

On the other hand, in the amplifier described in each of Patent Documents 1 to 3, the line (trace) length of an impedance transformation circuit connected to the output portion of a carrier amplifier is set to 0 to ½ of the wavelength. With this arrangement, each Patent Document asserts that the line length of the impedance transformation circuit is experimentally set to the load point at which both a distortion characteristic is compensated for and an efficiency characteristic is achieved. However, this method does not perfectly satisfy impedance matching as a Doherty operation. That is, there is a problem that adjustment of performance of the amplifier in each time becomes necessary.

The present invention has been made to solve the above-mentioned problem(s). It is therefore an object of the invention to provide a compact amplifier that satisfies a matching condition.

An amplifier according to one aspect of the present invention is an amplifier that obtains an output by power combining. The amplifier comprises:

a distribution circuit that distributes an input signal into two signals;

a first amplifier circuit that amplifies one of the two signals distributed by the distribution circuit and operates in class AB mode;

a second amplifier circuit that amplifies the other of the two signals distributed by the distribution circuit and operates in class B or C operation mode;

a lumped constant circuit that connects outputs of the first and second amplifier circuits;

a first impedance transformation circuit connected to an output of the first amplifier circuit;

a second impedance transformation circuit connected to an output of the second amplifier circuit; and a quarter wavelength impedance transformation circuit with one end thereof connected to a combining point of output sides of the first and second impedance transformation circuits and with the other end thereof connected to a load.

According to the present invention, by including the lumped constant circuit, a compact amplifier that satisfies a matching condition can be implemented.

BRIEF DESCRIPTION OF THE DRAWINGS

FIGS. 2A and 2B respectively show equivalent circuits when a peak amplifier of the amplifier according to the exemplary embodiment of the present invention is turned off and when the peak amplifier is turned on;

PREFERRED MODES

An amplifier according to an exemplary embodiment of the present invention is an amplifier that obtains an output by power combining. The amplifier includes:

a distribution circuit that distributes an input signal into two signals;

a first amplifier circuit that amplifies one of the two signals distributed by the distribution circuit and operates in class AB mode;

a second amplifier circuit that amplifies the other of the two signals distributed by the distribution circuit and operates in class B or C operation mode;

a lumped constant circuit that connects outputs of the first and second amplifier circuits;

a first impedance transformation circuit connected to an output of the first amplifier circuit;

a second impedance transformation circuit connected to an output of the second amplifier circuit; and a quarter wavelength impedance transformation circuit with one end thereof connected to a combining point of output sides of the first and second impedance transformation circuits and with the other end thereof connected to a load.

Preferably, the lumped constant circuit in the amplifier of the present invention comprises a capacitor, an inductor, and a resistor connected in parallel.

Preferably, the first and second impedance transformation circuits in the amplifier of the present invention are constructed with a micro strip line (trace) of a one-eighth wavelength circuit.

The distribution circuit in the amplifier of the present invention may include for one of the first and second amplifier circuits a variable phase converter that converts phase of the input signal.

A detailed description will be given, with reference to drawings.

Figure 1:
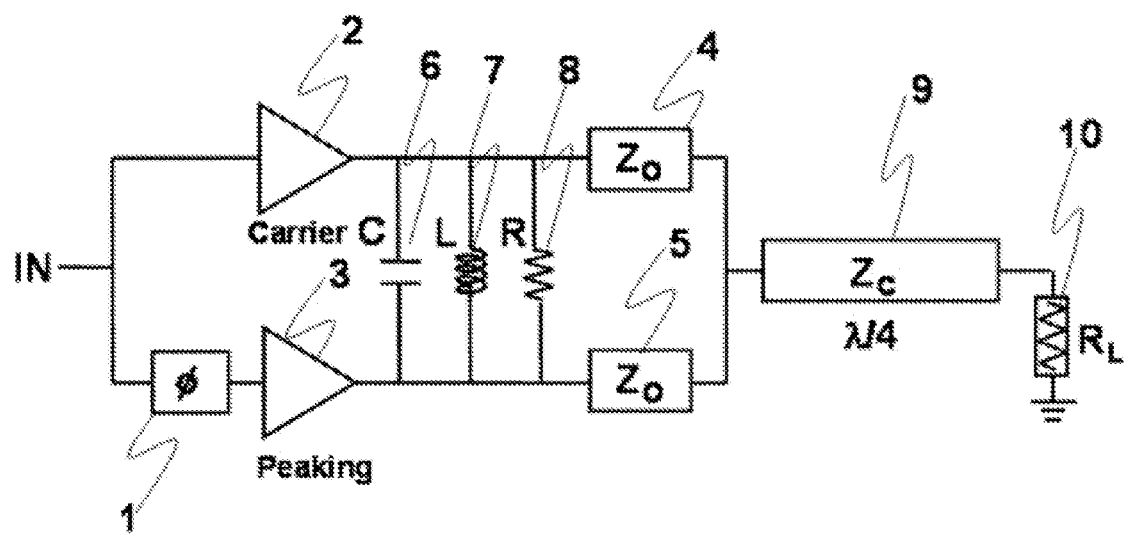
FIG. 1 is a circuit diagram of an amplifier according to an exemplary embodiment of the present invention.

FIG. 1 is a circuit diagram of the amplifier according to the exemplary embodiment of the present invention. Referring to FIG. 1, the amplifier includes a phase converter 1, a carrier amplifier 2, a peak amplifier 3, impedance transformation circuits 4 and 5, a capacitor 6, an inductor 7, a resistive element 8, and a quarter wavelength impedance transformation circuit 9 (having a characteristic impedance $Z_c=\sqrt{2R_L}$). The amplifier drives an output load 10.

The carrier amplifier 2 is an amplifier that operates in class AB mode in which linear amplification of an input signal IN is performed. The phase shifter 1 shifts the phase of the input signal IN and gives a phase-shifted input signal to the peak amplifier 3. The peak amplifier 3 is an amplifier that operates in class B or C mode in which power of a certain input level or more is amplified. The capacitor 6, inductor 7, and resistor 8 are connected in parallel, and are connected between outputs of the carrier amplifier 2 and the peak amplifier 3 as the lumped constant circuit. The impedance transformation circuits 4 and 5 are circuits which are, respectively, connected to outputs of the carrier amplifier 2 and the peak amplifier 3, and each of which has a characteristic impedance $Z_0$ and a one-eighth wavelength impedance. Output ends of the impedance transformation circuits 4 and 5 are connected in common to the load 10 through the quarter wavelength impedance transformation circuit 9.

Figure 2A:
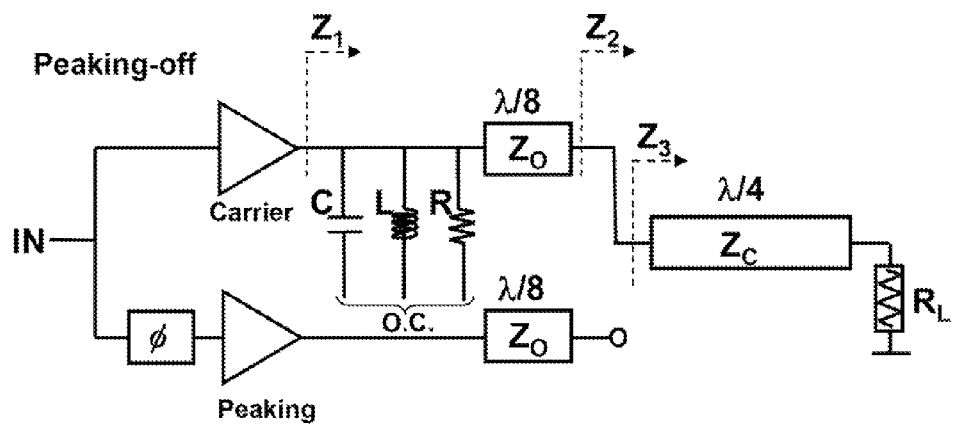

An equivalent circuit for the amplifier when the peak amplifier 3 is turned off is shown in FIG. 2A. In this case, the lumped constant circuit is regarded to be in an open condition (o.c.), and does not contribute to impedance transformation. When an impedance after transformation by the quarter wavelength impedance transformation circuit 9 (having the characteristic impedance $Z_c$ is set to $Z_2$ and an impedance $Z_1$ for an output side of the carrier amplifier 2 is set to $2R_L$, matching of an output impedance of the carrier amplifier 2 is performed by setting the characteristic impedance $Z_0$ of the one-eighth wavelength impedance transformation circuit 4 to $2R_L$, based on the following equations:

$$Z_0 = 2R_L$$

$$Z_C = \sqrt{Z_s \cdot R_L} = \sqrt{Z_0 \cdot R_L} = \sqrt{2}R_L \qquad (1)$$

Figure 2B:
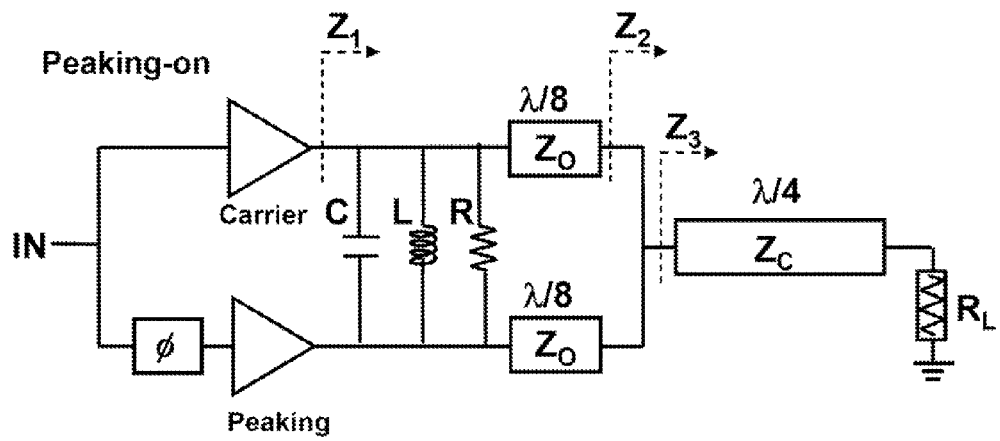

Next, an equivalent circuit for the amplifier when the peak amplifier 3 is turned on is shown in FIG. 2B.

In this case, when an impedance for the load from the power combining portion of the carrier amplifier 2 and the peak amplifier 3 through the one-eighth wavelength impedance transformation circuit 4 and the lumped constant circuit (formed of the capacitor 6, inductor 7, and resistor 8) is set to $Z_3$, there is the following relationship:

$$\frac{2}{Z_3} = \frac{i \cdot Z_1 - Z_0}{i \cdot Z_0^2 - Z_0 Z_1} + i \cdot \left(2\omega C - \frac{2}{\omega L}\right) + \frac{2}{R} \qquad (2)$$

At this time, provided that the impedance $z_1$ for the output side of the carrier amplifier 2 is indicated by $R_L$, each parameter of the lumped constant circuit is determined as follows:

$$R = \frac{10}{3}R_L \qquad (3)$$

$$2\omega C - \frac{2}{\omega L} + \frac{3}{10R_L} = 0$$

By determining each element value of the lumped constant circuit according to Equations (3), the impedance $Z_1$ for the output side of the carrier amplifier 2 varies from $2R_L$ to $R_1$ as the state of the peak amplifier 3 is changed from an off state to an on state. A Doherty operation is thereby performed.

Figure 3:
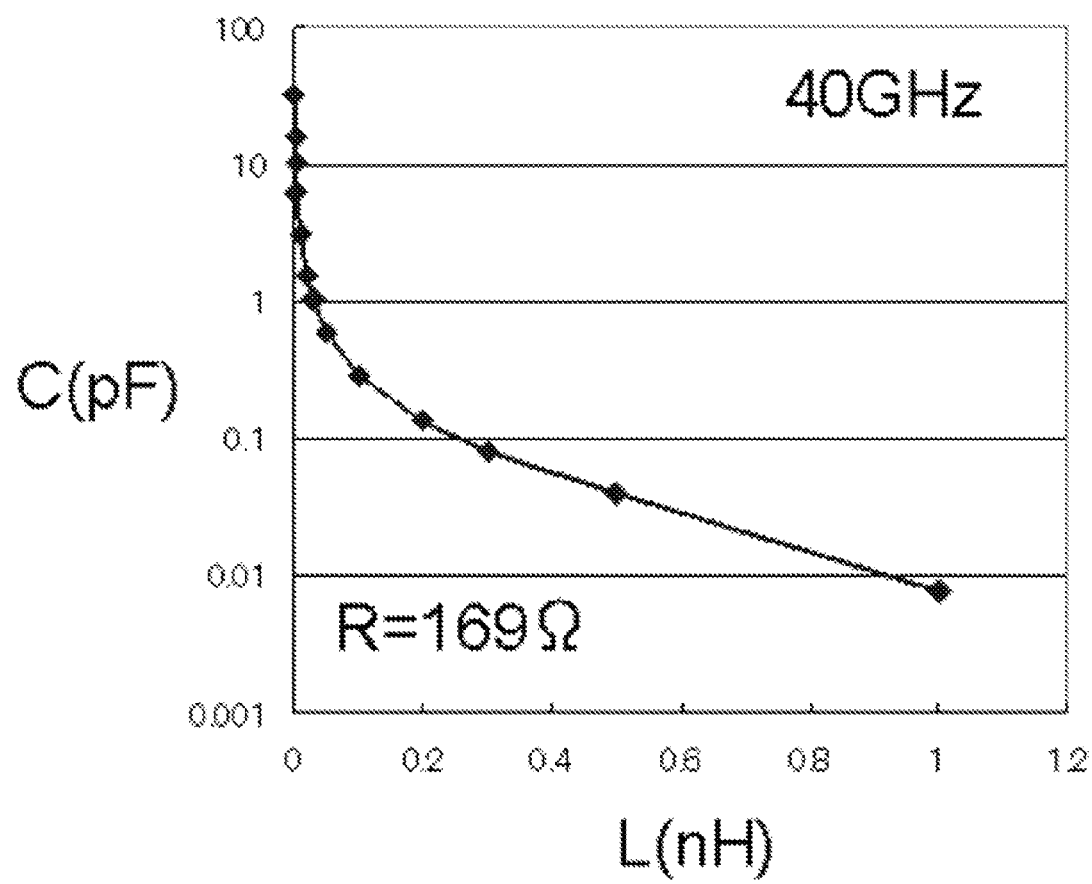
FIG. 3 is a graph showing a relationship among a capacitor C, an inductor L, and a resistor R when the amplifier is implemented at a frequency of 40 GHz.
Figure 4:
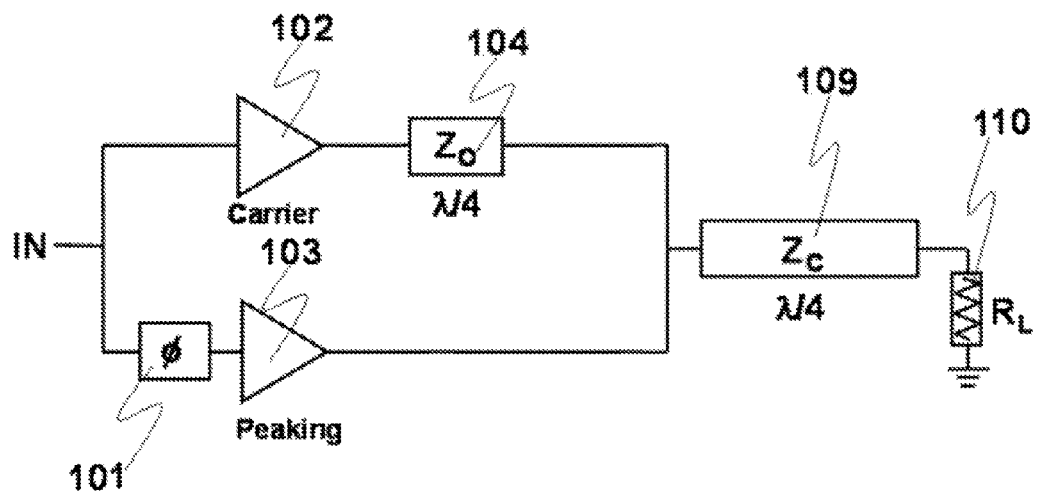
FIG. 4 is a diagram showing a configuration of a traditional Doherty-type amplifier.

FIG. 3 is a graph showing a relationship among the respective elements (R, L, C) of the lumped constant circuit when the amplifier is designed at a frequency of 40 GHz. Referring to Equation (3), for example, when a capacitance value C of the capacitor 6 is set to 0.1 PF, impedance matching as a Doherty amplifier can be perfectly performed by setting an inductance L of the inductor 7 to 0.25 nH (and setting a resistance value R of the resistive element 8 to 169Ω). These values are achievable in a microwave integrated circuit (MMIC).

In the above description, analysis was made, assuming that each of the impedance transformation circuits 4 and 5 respectively connected to the carrier amplifier 2 and the peak amplifier 3 has the one-eighth wavelength impedance. In the case of an impedance transformation circuit with an arbitrary line length, Equation (2) is converted to an expression that determines a matching condition using the line length as a parameter. Thus, Equation (2) can uniquely describe a perfect matching condition.

While the phase shifter 1 is a circuit that ideally performs a phase shift of 90 degrees, a phase shift angle may be fixed to the one from which a highest efficiency can be obtained, taking into account of a signal phase difference between the carrier amplifier 2 and the peak amplifier 3. The load on the carrier amplifier is $2R_L$, which is very large. Thus, the amplifier of the present invention can obtain a large efficiency characteristic close to the theoretical limit, especially when using a semiconductor element (such as GaN in particular) that includes a high breakdown voltage characteristic and can perform a high-voltage operation. Any one of a compound semiconductor and a Si-based semiconductor may be applied to the amplifier of the present invention.

In the amplifier according to the exemplary embodiment of the present invention, each of the impedance transformation circuits 4 and 5 is the one-eighth wavelength circuit. Thus, a degree of freedom in a circuit layout is more increased than with a quarter wavelength impedance transformation circuit in a traditionally Doherty amplifier. The size of the amplifier can be thereby reduced more.

Modifications and adjustments of the exemplary embodiment and an example are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

EXPLANATION OF SYMBOLS 1 phase shifter
2 carrier amplifier
3 peak amplifier
4, 5 impedance transformation circuit
6 capacitor
7 inductor
8 resistive element
9 quarter wavelength impedance transformation circuit
10 load

The invention claimed is:

1. An amplifier that obtains an output by power combining, comprising:
   a distribution circuit that distributes an input signal into two signals;
   a first amplifier circuit that amplifies one of the two signals distributed by the distribution circuit and operates in class AB mode;
   a second amplifier circuit that amplifies the other of the two signals distributed by the distribution circuit and operates in class B or C operation mode;
   a lumped constant circuit that connects outputs of the first and second amplifier circuits and that performs impedance transformation;
   a first impedance transformation circuit connected to an output of the first amplifier circuit;
   a second impedance transformation circuit connected to an output of the second amplifier circuit; and
   a quarter wavelength impedance transformation circuit with one end thereof connected to a combining point of output sides of the first and second impedance transformation circuits and with the other end thereof connected to a load.

2. The amplifier according to claim 1, wherein the lumped constant circuit comprises a capacitor, an inductor, and a resistor connected in parallel.

3. The amplifier according to claim 1, wherein the first and second impedance transformation circuits are constructed with a micro strip line of a one-eighth wavelength circuit.

4. The amplifier according to claim 1, wherein the distribution circuit includes for one of the first and second amplifier circuits a variable phase converter that converts a phase of the input signal.

* * * * *